United States Patent
Medd et al.

[11] Patent Number: 6,029,262
[45] Date of Patent: Feb. 22, 2000

[54] GRAPHICAL EDITOR FOR DEFINING MEMORY TEST SEQUENCES

[75] Inventors: Jack A. Medd, Woodlawn; Po Wen Chin, Ottawa, both of Canada

[73] Assignee: Mosaid Technologies Incorporated, Carp, Canada

[21] Appl. No.: 08/978,083

[22] Filed: Nov. 25, 1997

[51] Int. Cl.$^7$ .................................................. G01R 31/28
[52] U.S. Cl. ............................................ 714/724; 714/738
[58] Field of Search ............................... 714/724, 718, 714/738, 742, 744, 25; 702/118, 124, 125, 126; 345/507, 519; 395/701

[56] References Cited

U.S. PATENT DOCUMENTS

| | | | |
|---|---|---|---|
| 4,315,315 | 2/1982 | Kossiakoff | 364/300 |
| 4,460,999 | 7/1984 | Schmidt | 371/21 |
| 5,153,886 | 10/1992 | Tuttle | 371/67 |
| 5,220,512 | 6/1993 | Watkins et al. | 364/489 |
| 5,293,478 | 3/1994 | Yamamoto et al. | 395/161 |
| 5,371,851 | 12/1994 | Pieper et al. | 395/164 |
| 5,392,294 | 2/1995 | Bosch et al. | 371/21.2 |
| 5,461,310 | 10/1995 | Cheung et al. | 324/158.1 |
| 5,557,559 | 9/1996 | Rhodes | 364/580 |
| 5,623,418 | 4/1997 | Rostoker et al. | 364/489 |
| 5,644,581 | 7/1997 | Wu | 371/27 |
| 5,910,895 | 6/1999 | Proskauer et al. | 364/468.28 |

*Primary Examiner*—Hoa T. Nguyen
*Attorney, Agent, or Firm*—Hamilton, Brook, Smith & Reynolds, P.C.

[57] ABSTRACT

A technique for specifying test signals such as to be applied to a memory integrated circuit, by graphically displaying and editing a sequence of test cycles, together with a graphic indication of parameters that specify which of the test cycles are to be repeated. The preparation of detailed instructions for tester equipment may therefore be carried out automatically by computer software that interprets the graphic indications and generates tester microcode. As a result, knowledge of test equipment programming is not required to prepare test programs.

23 Claims, 13 Drawing Sheets

```
GroupName = ReadRow
Group Store Num = 0011
Group Type = 008E
wNumCycles = 0015  wFirstActiveCycle = 0000  wLastActiveCycle = 0014
eLoopType = 0001  wLoopFrom = 0008  wLoopTo = 000D  dwLoopCount = 00000000
eBankAddrMode = 0000

Active Cycles:
Cyc#  CycLE  CKE   CS    RAS   CAS   WE    STB   BANK  CYC-OPT   AOP   VAL
0000  5C12   0001  0000  0000  0001  0001  0000  0001  00000000  0004  0000
0001  5C03   0001  0001  0000  0000  0000  0000  00FF  00000000  0004  0000
0002  5C0C   0001  0000  0001  0000  0000  0000  0001  00000000  0004  0000
0003  5C03   0001  0001  0000  0000  0000  0000  00FF  00000000  0004  0000
0004  5C05   0001  0000  0001  0001  0001  0001  00FF  00000000  0004  0000
0005  5C05   0001  0000  0001  0001  0001  0001  00FF  00000000  0004  0000
0006  5C05   0001  0000  0001  0001  0001  0001  00FF  00000000  0004  0000
0007  5C05   0001  0000  0001  0001  0001  0001  0001  00000000  0002  0000
0008  5C0C   0001  0000  0001  0000  0000  0000  00FF  00000000  0004  0000
0009  5C03   0001  0001  0000  0000  0000  0000  00FF  00000000  0004  0000
000A  5C05   0001  0000  0001  0001  0001  0001  00FF  00000000  0004  0000
000B  5C05   0001  0000  0001  0001  0001  0001  00FF  00000000  0004  0000
000C  5C05   0001  0000  0001  0001  0001  0001  00FF  00000000  0004  0000
000D  5C05   0001  0000  0001  0001  0001  0001  00FF  00000000  0002  0000
000E  5C0C   0001  0000  0001  0000  0000  0000  00FF  00000000  0004  0000
000F  5C03   0001  0001  0000  0000  0000  0000  00FF  00000000  0004  0000
0010  5C05   0001  0000  0001  0001  0001  0001  00FF  00000000  0004  0000
0011  5C05   0001  0000  0001  0001  0001  0001  00FF  00000000  0004  0000
0012  5C05   0001  0000  0001  0001  0001  0001  00FF  00000000  0002  0000
0013  5C05   0001  0000  0001  0001  0001  0001  00FF  00000000  0002  0000
0014  5C03   0001  0001  0000  0000  0000  0000  00FF  00000000  0004  0000
```

FIG. 3

| Seq | Cycle | X Address | Y Address | Counters | FlowCtl |
|---|---|---|---|---|---|
| [-] Scan Array GS | | | | | |
| 0001 | ACT | A_LOC=FIRST_LOC | K | | |
| 0002 | WRT | A_LOC | A_LOC=FIRST_LOC | | |
| 0003 | NOP | A_LOC | A_LOC=A_LOC+K1 | | |
| 0004 | NOP | A_LOC | A_LOC=A_LOC+K1 | | |
| 0005 | NOP | A_LOC | A_LOC=A_LOC+K1 | | |
| 0006 | WRT | A_LOC | A_LOC=FIRST_LOC+0004 | | |
| 0007 | NOP | A_LOC | A_LOC=A_LOC+K1 | | |
| 0008 | NOP | A_LOC | A_LOC=A_LOC+K1 | | |
| 0009 | NOP | A_LOC | A_LOC=A_LOC+K1 | CTR_X8=58 | |
| 0010 | WRT | A_LOC | A_LOC=A_LOC+K1 | | |
| 0011 | NOP | A_LOC | A_LOC=A_LOC+K1 | | |
| 0012 | NOP | A_LOC | A_LOC=A_LOC+K1 | | |
| 0013 | NOP | A_LOC | A_LOC=A_LOC+K1 | CTR_X8-1 | If CTR_X8!=0 JumpTo 0010 |
| 0014 | WRT | A_LOC | A_LOC=A_LOC+K1 | | |
| 0015 | NOP | A_LOC | A_LOC=A_LOC+K1 | | |
| 0016 | NOP | A_LOC | A_LOC=A_LOC+K1 | | |
| 0017 | NOP | A_LOC | A_LOC=A_LOC+K1 | | |
| 0018 | WRT | A_LOC | A_LOC=A_LOC+K1 | | |
| 0019 | NOP | A_LOC | A_LOC=A_LOC+K1 | | |
| 0020 | NOP | A_LOC | A_LOC=A_LOC+K1 | | |
| 0021 | NOP | A_LOC | KD | | |
| 0022 | PRE | A_LOC | KD | | |
| 0023 | NOP | KO | KD | | |
| 0024 | NOP | KO | A_LOC=A_LOC | | JumpTo 0025 |
| 0025 | Null | A_LOC=A_LOC | | | |

FIG. 4

Column Definition

Column Type

STANDARD CYCLE

Standard Cycle Details

Cycle Options
- ☑ INVERT_DATA
- ☐ SYNC
- ☐ REFRESH_ENABLE
- ☑ STROBE_ENABLE
- ☐ A_PLANE_ENABLE
- ☐ B_PLANE_ENABLE

Advance Options

Cycle Type

Write

Address Calculation

Base Address  NEXT_BURST
+
Offset Value  3

Nested Cycle Details

GS Name

Vector List

Identifier

First Vector Number

Number of Vectors

[ Apply ]  [ Restore ]  [ Close ]

FIG. 8

GRAPHICAL EDITOR FOR DEFINING MEMORY TEST SEQUENCES

BACKGROUND OF THE INVENTION

The development of a new integrated circuit (IC) device requires not only that the circuit be designed in detail but also that the design be verified through testing. In addition, once a prototype device is available, before it can be released to production, extensive, detailed additional production testing is typically required. Given the extremely large number of transistors in present day IC devices, the development of test programs for both design verification and production has become a complex, time consuming, tedious and expensive process.

Consider that this process typically proceeds by a test engineer first preparing a formal detailed specification for testing the device. This test specification determines a set of logic signals to be applied to each input pin of the device for each of a long sequence of test cycles. Efficient coordination of the test development process is even more complicated if it is being performed during design verification, at which time test patterns may need to be changed and manipulated quickly.

In the case of memory components, the test specification typically defines a set of address, data, and command input signals to be applied to a memory device under test. The development of such specifications was rather straightforward for devices such as dynamic random access memories (DRAMs). However, with the advent of synchronous dynamic random access memories (SDRAMs), testing is more complex because of certain key differences in their internal structure. The most critical such difference for testing is that the operation of an SDRAM is synchronous, such that in order to ensure proper operation, all operations must occur synchronously with a master clock signal. Therefore, the exact timing of events is more critical when developing a test for an SDRAM.

SDRAM arrays can also be split into two or more independent memory banks, and therefore two or more rows of the memory can be active simultaneously. Also, a so-called burst mode allows multiple SDRAM locations to be accessed in sequence. Therefore, in order to fully test an SDRAM device, it becomes necessary to support testing of these different access modes and other operations.

It has been common for some time for a testing to be performed using automatic test equipment (ATE). With such equipment, the test engineer, or a programmer working closely with the test engineer, develops a set of computer instructions for the test in accordance with the test specification. The computer instructions specify the test as a set of program instructions for the test equipment that may be written in a computer language, such as C, Pascal, or a special purpose test equipment language. This test software typically defines the set of test signals mathematically, as a set of "vectors" to be applied to the memory device under test. The values of the vectors determine the state of each of the logic input pins of the device at any given point in time.

A significant drawback to this approach is that a high level of both electronic circuit design and software programming expertise is typically required to create the test software. The process requires a test engineer who understands the nuances of programming and a programmer who understands integrated circuit technology. The situation is now such that it typically requires months of training for either a test engineer or a programmer to become proficient at developing test equipment programs.

In addition, the access cycle time of memory ICs decreases as integrated circuit technologies inevitably improve. The associated test equipment must therefore maintain the same pace and increase its operating speed accordingly. One common approach to solving this problem is to use test equipment that includes multiple pattern generators operating in parallel. However, the presence of parallel hardware pattern generators further complicates the development of test programs, since synchronization of the operations of the various parallel processors must be taken into account.

It has in some instances been possible to take advantage of the developments in computer graphics to help with developing test procedures for logic circuit designs. For example, U.S. Pat. No. 5,371,851 issued to Pieper et al. and assigned to Credence Systems Corporation, describes a system for graphical editing of logic signals using a mouse and cursor. This type of system requires the user to specify a state for each logic signal in each cycle of the test.

In U.S. Pat. No. 5,557,559 issued to Rhodes and assigned to Motay Electronics, Inc., there is similarly described a waveform generator that provides a graphical display of logic signals to be applied to an integrated circuit under test.

However, direct application of these techniques does not particularly provide advantages in the memory testing environment, and particularly for more complicated memory devices such as SDRAM devices that presently require complex programming logic for efficient generation of a complete set of test sequences.

SUMMARY OF THE INVENTION

Briefly, the present invention is a technique for automatically preparing a test program such as for a memory integrated circuit (IC) in which graphic indications of the logic states for a set of test signals over a series of cycles are combined with graphic indications of test cycle repetition parameters. After the graphic indication of the test signal states and repetition parameters are prepared, detailed instructions for IC test equipment are then automatically generated by a compiler program that interprets a data structure representing the graphic indications of the test cycle repetition parameters to produce tester microcode and other test parameters. As a result, a test engineer need not create a computer program in order to prepare a test specification for a device such as a memory IC which includes cycle repetitions.

The graphic indication of the test cycle repetition may, for example, be provided by displaying one or more arrows adjacent a graphic view of a set of the logic signals to be applied in each test cycle. The arrows indicate the first and last cycle in a sequence of test cycles to be repeated. The user of the system may change the parameters of the test sequence by using a graphic input device such as a mouse to change the length and position of the arrow on the graphic display.

The graphic indication may also be made in other ways such as by shading or coloring the test cycles to be repeated.

A default specification may be provided in which test signals such as address signals are automatically cycled through all possible states during iteration of the specified test cycles so that all storage locations in the memory device are tested. Alternatively, the user may specify a number of iterations to be performed and/or patterns of addresses and/or data signals to be applied to the device for each iteration.

Multiple arrows may be used to indicate how test cycles are to be repeated in nested loops.

Further aspects of the graphic interface permit the user to specify the exact timing of strobe signals and other parameters of test signals during each test cycle.

The compiler program may take into account the fact that the test equipment makes use of one or more microcoded parallel processors and may automatically generate microcode for such processors to remain synchronized with one another without further requiring user involvement with programming.

The invention has several advantages over conventional memory testing techniques.

Unlike prior techniques, the test engineer need not have any knowledge of how to program in a tester-specific language in order to create a test for a memory IC. The invention therefore reduces the need for special training before using microprogramable test equipment which makes use of parallel processors, automatic pattern generators and the like.

The graphic sequence interface is presented in a form closely resembling device data sheets which is familiar to most integrated circuit design engineers, and therefore it is relatively easy to use by those who need the most direct control over the testing process.

In addition, the risk of inadvertently preparing invalid tests due to mistakes in the programming process is reduced.

BRIEF DESCRIPTION OF THE DRAWINGS

The above and further features of the invention include various novel details of construction and combination of components. These novel features will be more particularly pointed out in the following claims, and their advantages will also become evident as they are described in detail with reference to the accompanying drawings, in which:

FIG. 3 is a detailed view of a data structure resulting from the graphic sequence of FIG. 2;

FIG. 4 is microcode listing generated from the graphic sequence and data structure in FIGS. 2 and 3;

FIG. 8 illustrates how the graphic sequence editor may be used to further control cycle operations.

DETAILED DESCRIPTION OF A PREFERRED EMBODIMENT

Figure 1:
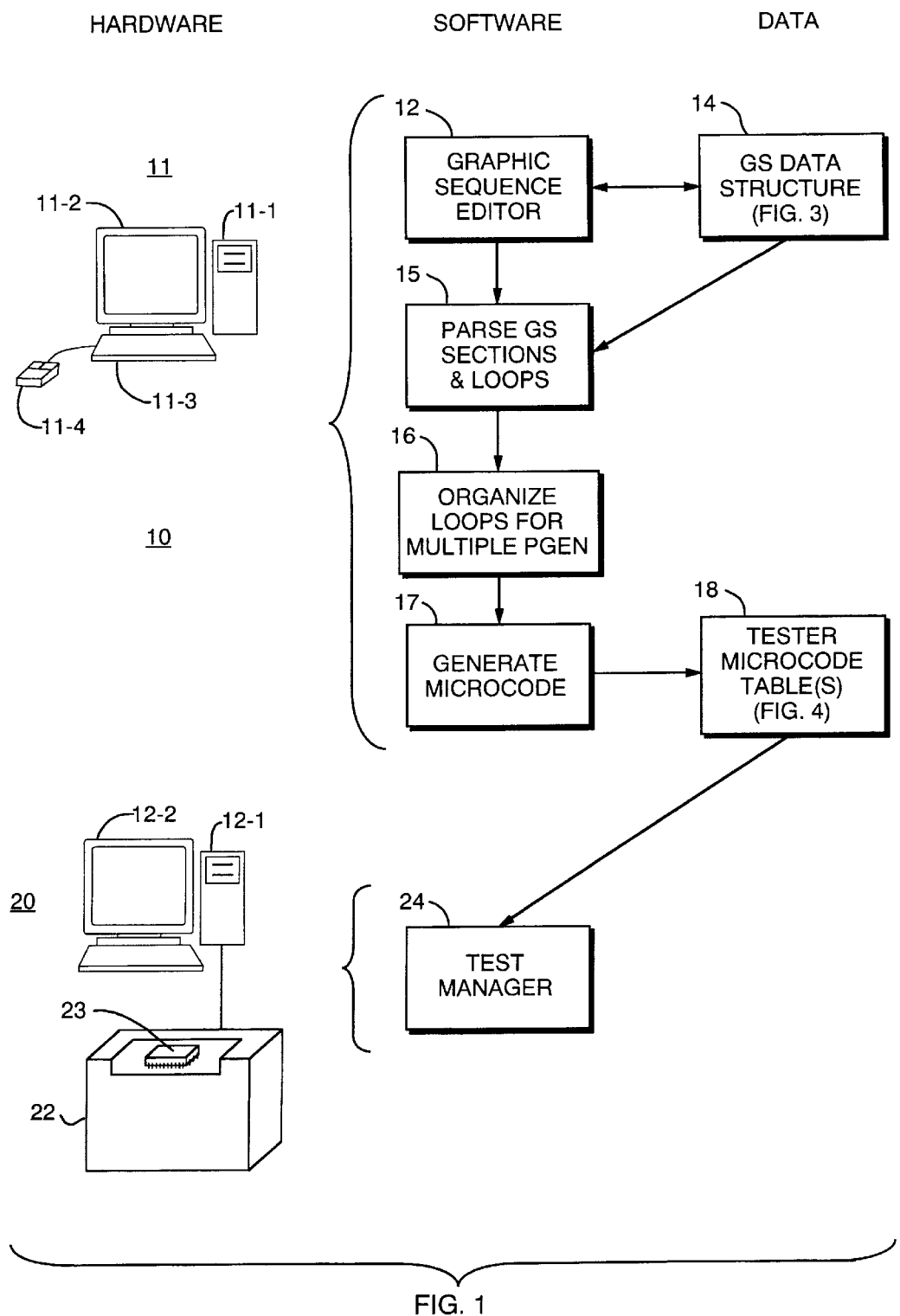
FIG. 1 is a generalized flow diagram of a set of operations performed to automatically prepare a test program for a memory integrated circuit (IC) according to the invention.

FIG. 1 is a flow diagram for a set of operations that are used according to the present invention to automatically define a microcode program for test equipment to apply a sequence of logic signals to a memory integrated circuit (IC).

The test program definition system 10 includes a graphic workstation 11, which executes a series of software programs, including a graphic sequence editor 12, a graphic sequence parser 15, a graphic sequence loop organizer 16, and a microcode generator 17. In the process of running these programs, the workstation 11 makes use of certain data structures, including a graphic sequence data structure 14 and tester microcode tables 18.

Tester microcode as represented in the microcode tables 18 is provided to automatic test equipment 20, including a tester host processor 21 and memory tester 22 that contains an integrated circuit (IC) device under test 23 such as a memory IC. The host 21 and/or memory test equipment 22 then cooperate with a test manager program 24 to issue instructions to the tester 22 to perform tests on the memory device 23 in accordance with the microcode instructions.

The workstation 11 contains components typical of a computer graphics workstation, including a central processing unit 11-1, a graphic display 11-2, and input devices such as a keyboard 11-3 and a mouse 11-4. The workstation 11 may, for example, be a Sun UNIX workstation available from Sun Microsystems, Inc. of Santa Clara, Calif. The host computer 21 may be an IBM-compatible Personal Computer (PC) and also includes a central processing unit 21-1 and a display 21-2. In the following discussion, it should be understood that the workstation 11 may be a separate computer as shown or may actually be the same computer as the test host 21 as a variation. In either event, the graphic sequence data structure 14 or the microcode tables 18 can be transferred to any variation of interconnected workstations 11 and hosts 21 to perform the graphic sequence editor 12, parser 15, loop organizer 16, and/or microcode generator 17 functions.

Figure 2:
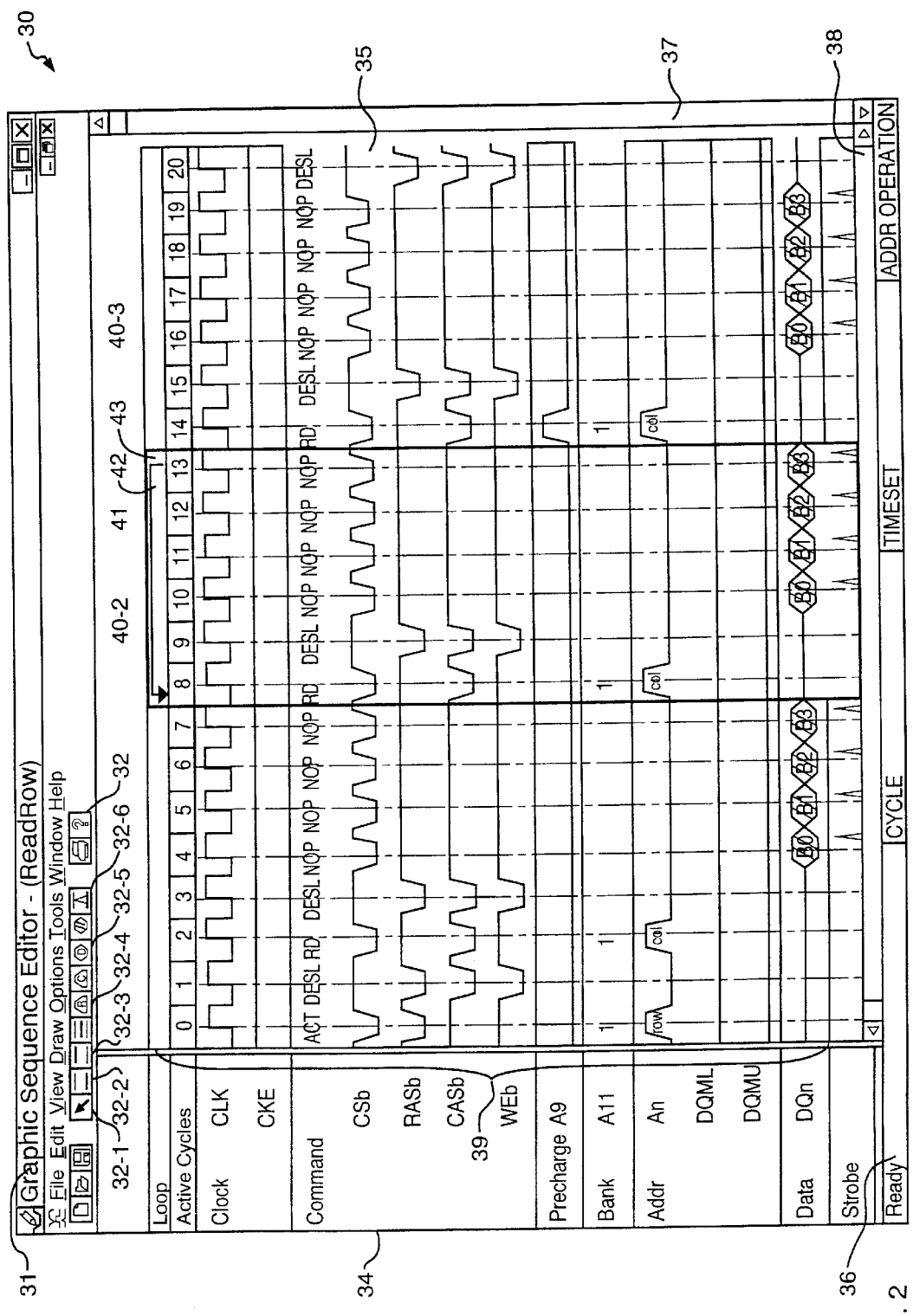
FIG. 2 is an example of a display presented to a user showing an example of a graphic sequence of test signals, including a specification of test repetition parameters, according to the invention.

Before discussing how these software programs automatically generate microcode for the tester 22, it will be instructive to first consider the graphical interface presented to a user of the system 10. FIG. 2 is one example of a graphic display presented on the display 11-2 during the process of executing the graphic sequence editor 12. A window 30 includes a number of regions or components such as a title bar 31, a menu bar 32, a static area 34, an active area 35, a status bar 36, a vertical scroll bar 37, a horizontal scroll bar 38, and a graphic sequence area 39. The graphic sequence area 39 is further divided into three sections 40-1, 40-2, 40-3.

One of the sections, 40-2, is a type of section referred to herein as a loop section 41. The loop section 41 is distinguished from the rest of the graphic sequence area 39 by a graphic indication such as a loop arrow 42. The ends of the loop arrow 42 also define the end of the first section 40-1 and beginning of the third section 40-3. The loop section 41 may also be indicated by shading of a set of cycles as shown, or in other ways which graphically distinguish cycles to be grouped together such as by color, labels, and the like.

Now more particularly, the graphic sequence of FIG. 2 is for a read row test in which all rows of an SDRAM memory device are to be read. The graphic sequence area 39 appears as a series of columns, ordered left to right, and numbered along the top in the row labeled "Active Cycles." The details of the actions that the memory tester 22 is to perform in each time slot, or cycle, are shown graphically in the rows of each column. For example, the voltage levels that the tester 22 is to apply to specific pins of the memory device 23 under test are shown as high and low voltage levels.

The signal names in the first column of the window 30 correspond more or less to signal pin names for the memory device 23. Each remaining column displayed therein typically defines a set of input signals, or vectors, to be applied to the memory device 23 during one test cycle. In the illustrated example, the user is developing a graphic indication of a test sequence for a SDRAM-type memory device 23 which is compatible with the Electronic Industry Association (EIA) Joint Electron Device Engineering Council (JEDEC) (Standard No. 21-C "Configuration for Solid States Memories"). In this test, a sequence of row locations are to be read-accessed.

For example, the user has specified that a waveform is to be applied to the clock input pin (CLK) of the memory device 23 consists of a series of alternating high and low voltage levels in the manner of a clock signal that generates one clock pulse per cycle.

Other waveforms specify signals to be provided to more than one pin of the memory device 23. For example, an address signal, An, is specified as a "row" address in cycle number 0 and as a "column" address during cycle number 2. The address signals actually provided to a number of address pins A10 through A0 of the memory device 23 are determined in a manner that is described in greater detail below.

Similarly, data outputs are specified by the waveform adjacent to the label DQn. Although shown as only a single waveform on the display, in reality this specifies that a number of data pins are to be read at the indicated cycle times.

In addition, tester actions such as the exact time of testing the validity of the output data pins DQn in specific cycles are shown graphically, in this case by the presence of an active mark in each cycle in the row entitled STROBE.

A burst length of four may be indicated by an entry in a column definition dialog box (FIG. 8) or by inserting four successive entries in the "Data" row, such that the contents of four successive locations will be read during the test.

The menu bar 32 may be used to provide easy access to functions that facilitate the graphical creation of test sequences in the form of waveforms that graphically depict the above-described signals to be applied to memory device 23. For example, a select button 32-1 may be used to select a current test cycle. A logic low button 32-2 or high button 32-3 may then be used to indicate that the state of selected cycle is to be a logic low or logic high, respectively, during the indicated test cycle.

A row address or column address tool button 32-4 or 32-5 may be used to indicate that the current selection is to be tested as a row address or a column address, respectively. Data or strobe signals can also be specified via data or strobe buttons 32-6 or 32-7, respectively.

Unique to the present invention is the ability to specify, by way of a graphic indication such as the loop arrow 42, shaded area 43 or other indication, when and how certain cycles are to be repeated. Consider that memory ICs, such as SDRAMs, are organized as a large two dimensional array of rows and columns of identical memory cells. In addition, SDRAMs are typically accessed in a burst mode, whereby multiple adjacent locations may be written or read with a single command sequence. Writing or reading the cells of an SDRAM row therefore typically requires one set of cycles for accessing the first few one or more cells and another set of cycles for the remainder of the cells. Similarly, there is sometimes a requirement for unique waveforms to be applied during the very last few cells of a row access. The present invention provides for the addition of specifications to sections of the test sequence in a manner which advantageously takes these requirements into account.

In particular, one of the sections in the graphic sequence area 39, such as middle section 40-2, may be defined by the user as a looping section 41 which specifies a group of cycles that are to be performed repeatedly. This is indicated by the user creating a graphic depiction of addition of a loop arrow 42 adjacent to the looping section 41. The cycles in section 40-1 that occur before the looping section 41 are therefore performed once prior to accessing the first few cells. The cycles within the looping section 41 are then performed repeatedly, and the sections after, or to the right of the arrow 42 in section 40-3, are performed once to access the last few cells.

As a whole, this division of cycles in sections 40-1, 40-2, and 40-3 provides sufficient information for the tester 22 to completely test the memory device 23. The graphic sequence editor 12 thus provides a mechanism to graphically specify test sequences that include initial setup, repetition, and closing final commands without the need to write specialized computer software programs.

Detailed instructions for the memory tester 22 to control each cycle of the test in the form of microcode are then automatically created from the graphic sequence by the additional software shown in FIG. 1. This software converts the graphical sequence shown in FIG. 2, into a series of microcode instructions stored in a microcode table 18. The microcode instructions 18 are then used by the automatic memory tester 20 to generate signals to control the test process. No writing of computer language test procedures is required by the user, and the user of the graphic sequence editor 12 need not be involved with generation of microcode directly at all.

To understand how this is accomplished, consider FIG. 3 which illustrates a graphic sequence data structure 14 generated by the graphic sequence editor 12 from the display of FIG. 2. The data structure 14 includes a number of columns of data corresponding, more or less, to the logic state of the waveforms specified by the rows of FIG. 2. The first column includes cycle numbers (please note that cycle numbers and other numbers in FIG. 3 are in hexadecimal form); there is a row of the data structure 19 for each of the twenty-one cycles of FIG. 2.

A second column labeled "Cycle" contains a hexadecimal code for the command label applied to each particular cycle as indicated on the COMMAND line in FIG. 2. The columns labeled CS, RAS, CAS, and WE correspond to the chip select, row address strobe, column address strobe, and write enable waveforms specified in the rows of FIG. 2. The STB column corresponds to the state of the STROBE signal and the BANK column corresponds to the BANK select input (A11).

The foregoing portions of the data structure 14 are generated directly from the graphical high and low voltage levels for each cycle as specified by the user. However, the data structure 14 also includes data that is generated from the graphic indications such as the loop arrow 42. In particular, the loop arrow 42 causes an entry to be made in the data structure 14 in the fifth line labeled "eLoopType". This entry indicates that a repetition loop extends from cycle number 008 through cycle number 00D, and that the logic signals for those cycles be repeated for each possible value of a row address.

FIG. 4 shows a detailed set of tester instructions, or microcode, as derived from the data structure 14 to control each cycle of the operation of the memory tester 22. The microcode is generated by the parser 15, loop organizer 16, and microcode generator 17 shown in FIG. 1 operating on the graphic sequence data structure 14. The resulting microcode is stored as a microcode table 18 output from the microcode generator 17.

The parser 15 operates on the data structure 14 to separate loop related instructions and passes them to the loop organizer 16 and microcode generator 17. In the particular example discussed in connection with FIG. 4, the microcode generator 17 outputs microcode intended to operate with a MOSAID MS4105 memory tester available from MOSAID Technologies Inc., of Santa Clara, Calif. and Kanata, Ontario, Canada. This type of tester uses a number of different registers, including an address register A_LOC, typically used for holding address information, and constant registers for holding constant data values, such as K0 and K1, that hold constant values 0 and 1 respectively.

The MS4105 tester also makes use of a number of processors operating in parallel. As shown in FIG. 4, the parser 15 generates a microcode instruction column for each of several processors in the memory tester 22. For example, a first processor known as the "XAddress" processor executes instructions in accordance with the microcode in the second column. A second processor known as the "YAddress" processor executes microcode instructions as shown in the third column.

Turning attention to the column of microcode instructions performed by the XAddress processor, its address register A_LOC is first set equal to the contents of a register FIRST_LOC that by convention is preloaded with a default initial address to be applied to the memory device 23. The XAddress processor is responsible for generating the row addresses to be applied to the device 23. As shown in the microcode sequence, the row address is held constant for the iterations of this particular test.

The instructions for the YAddress processor, shown in the second column, also stores a first location in its corresponding address register A_LOC. (It is understood that the XAddress processor and YAddress processor are similar in construction and operation but they operate in parallel and therefore have a completely parallel set of registers.) The contents of the A_LOC register in the YAddress processor are then used as the column address to be applied to the device under test 23. It is this register which is incremented as each iteration of microcode steps is performed.

Microcode for a control processor which controls the looping of operations as output by the loop organizer 16 and microcode generator 17 is also shown in the fourth and fifth columns of FIG. 4. This microcode initiates a counter value in step 9 and decrements the counter in step 0013, causing a jump back to step 0010 upon each iteration. Thus, steps 0010 through 0013 of the microcode shown in FIG. 4 are iteratively performed until the counter register CTR_X8 decrements to a value 0.

It can now be understood therefore that the control processor controls information to be applied directly from the "eLoopType" information extracted by the loop parser 15 and organizer 16 from the data structure 14 and that the address register information for the XAddress and YAddress processors is derived from the active cycle table portion.

The software steps that generate the tester microcode 18, including the parser 15, the loop organizer 16, and the microcode generator 17 can be performed at any convenient time. For example, in the preferred embodiment, they are typically performed when an external event requires the generation of a row test program. As a variation, they can be performed whenever the graphic sequence editor 12 is used to generate a new or revised graphic sequence data structure 14. Additionally, although FIG. 1 shows the creation of the intermediate microcode table 18 in the memory of a design workstation 11, it should be understood that the microcode table 18 could also be created or later transferred whenever the tester hardware 22 requires it for execution. As a design variation, the microcode table 18 could also be sent directly to the test manager 24 upon completion of the graphical sequence which specifies the test.

It can now be understood how the invention eliminates the need for writing specific test language programs to create or generate a test sequence, and this eliminates a time consuming and error prone process as memory components and testing systems become more complex.

In addition, the invention reduces the need to have a highly competent microcode programmer create test sequences. With the graphical sequence editor approach, memory test sequence generation becomes a relatively fast process. This is especially true in the case where the test equipment makes use of multiple pattern generators that require the interleaving of test sequence instructions.

Figure 5:
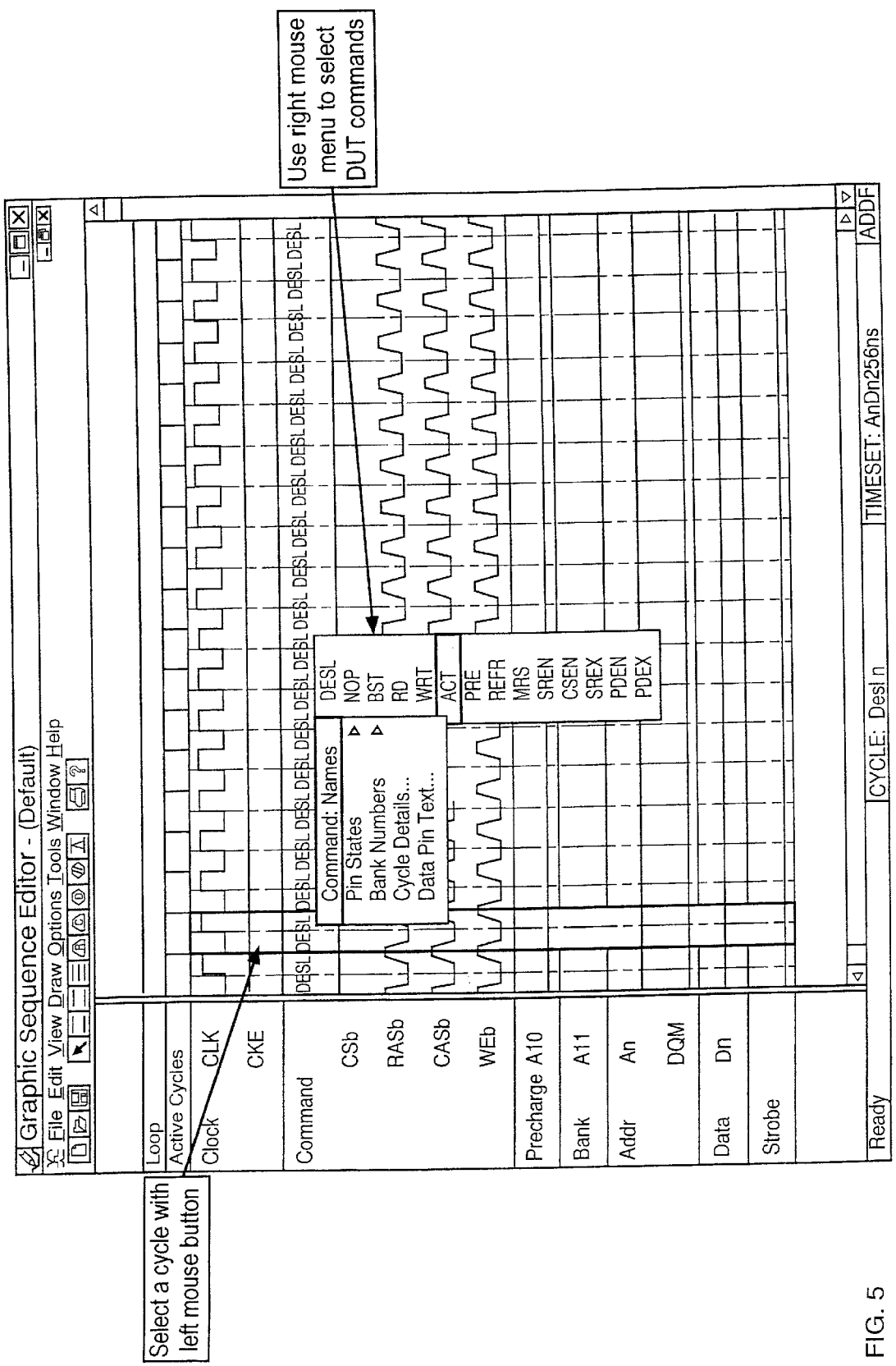
FIG. 5 shows one step in the process of preparing a graphic sequence used to specify test cycle commands.

The remaining drawings further illustrate principles of the invention. For example, FIG. 5 shows a more detailed view of one operation performed by the graphic sequence editor 12. In particular, command names may be labeled in each test cycle by first selecting the cycle, such as by clicking the mouse 11-4 on the select button 32-1. This causes a command name menu to be displayed, and the user may then use the mouse 11-4 to select a label for the command to be applied to the cycle.

Figure 6:
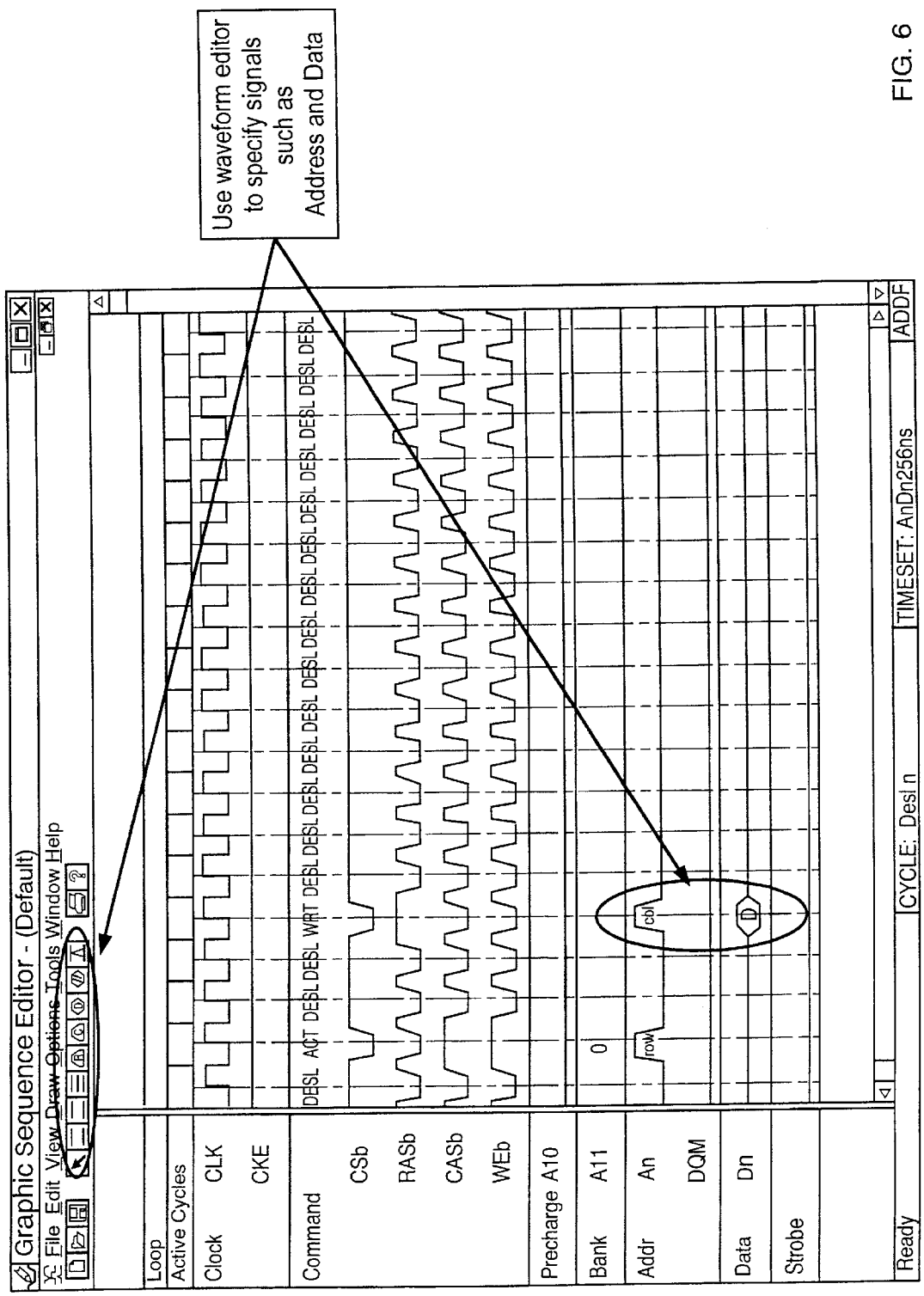
FIG. 6 shows how the graphic sequence editor may be used to specify the state of address and data signals.

FIG. 6 shows a set of operations by which the graphic sequence editor 12 may be used to specify signals such as address and data signals. As shown, the user may click the row address button 32-4 causing the cursor to change to a drawing tool. The mouse cursor is then placed over the selected row and clicked to indicate an activate row read cycle "ACT" in cycle 1. The row address graphic indication, such as a waveform pulse with the label "ROW," then appears in the desired cycle of the test sequence.

A column address can be similarly specified by using the column address button 32-5, such as in the activate write cycle "WRT" in cycle 5.

Figure 7:
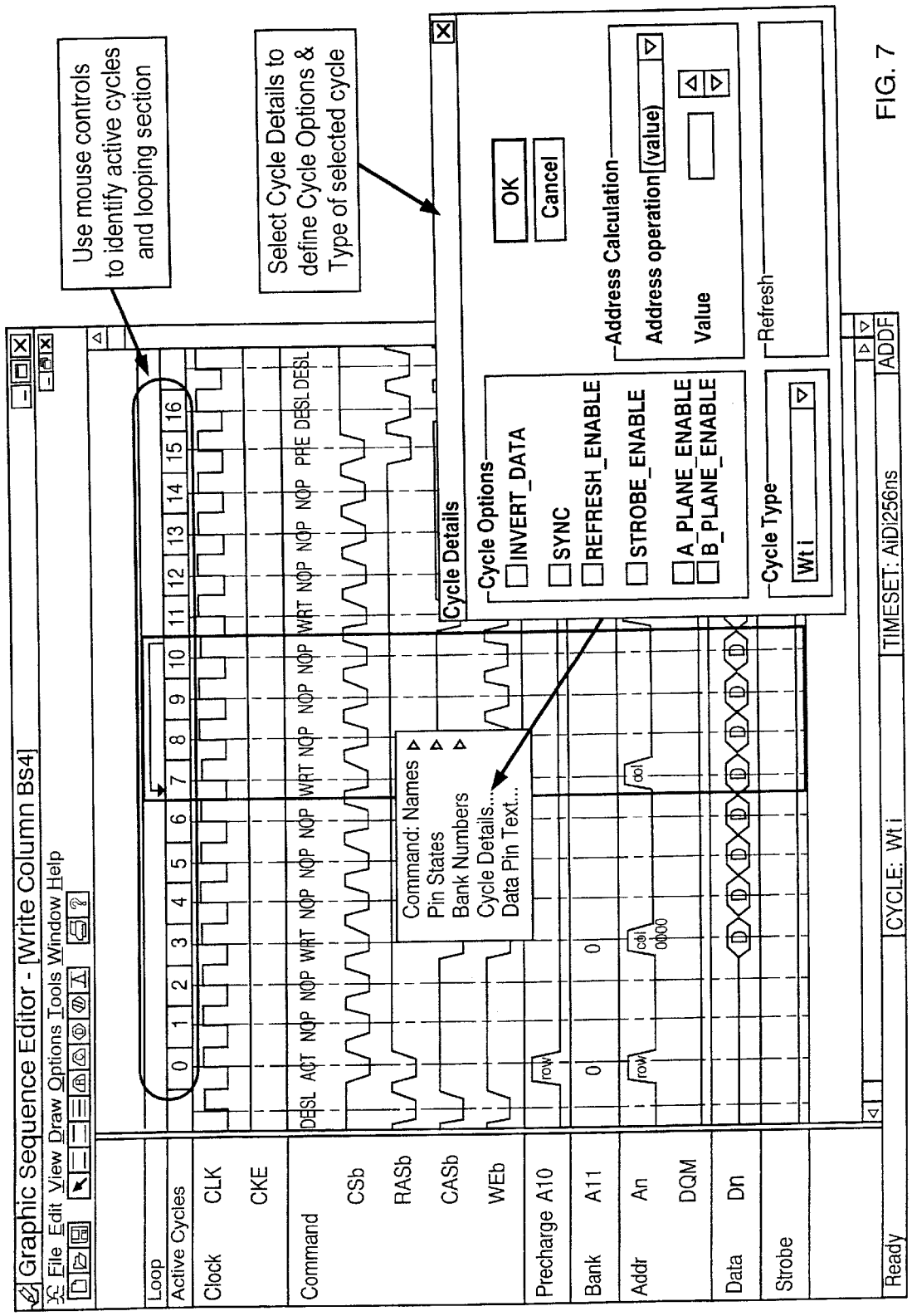
FIG. 7 shows how the user defines active cycles in a looping section.

FIG. 7 shows an example of how loop commands may be graphically defined. In particular, the user, again using the mouse 11-4, clicks on any one of the cycles, such as cycle number 7, to be the first cycle in the desired looping sequence. By holding down the mouse button and then dragging the mouse from left to right across the columns to cycle number 10, the user then releases the mouse to define the last cycle in the looping sequence. A thick black arrow 42 appears above the loop spanning the cycles within the loop 41. The standard loop definition also means that any cycle labeled with a graphic such as "row" or "col" within the loop is to be repeated for every row or column, respectively, that exists in the device 23.

The user may also optionally select a cycle detail operation to specify cycle options and the type of selected cycle including command names, individual pin states, enable the bank numbers or cycle data pin text or cycle details. Cycle details may include check boxes to invert data, generate refresh enable or strobe enable or memory plain enable signals.

For example, FIG. 8 shows in greater detail how further options may be specified for each cycle of a graphic sequence. This detail entry dialog box is typically less commonly used but permits the user to request, for example, specific inversion of the data polarity for a selected cycle, explicit address calculation and offsets, and other specifications of vectors.

An address pattern window may also be used to define the size of the device 23 so that all row and columns will be tested on an iteration, or to specify more complicated signal patterns such as a special address pattern more particularly.

Figure 9:
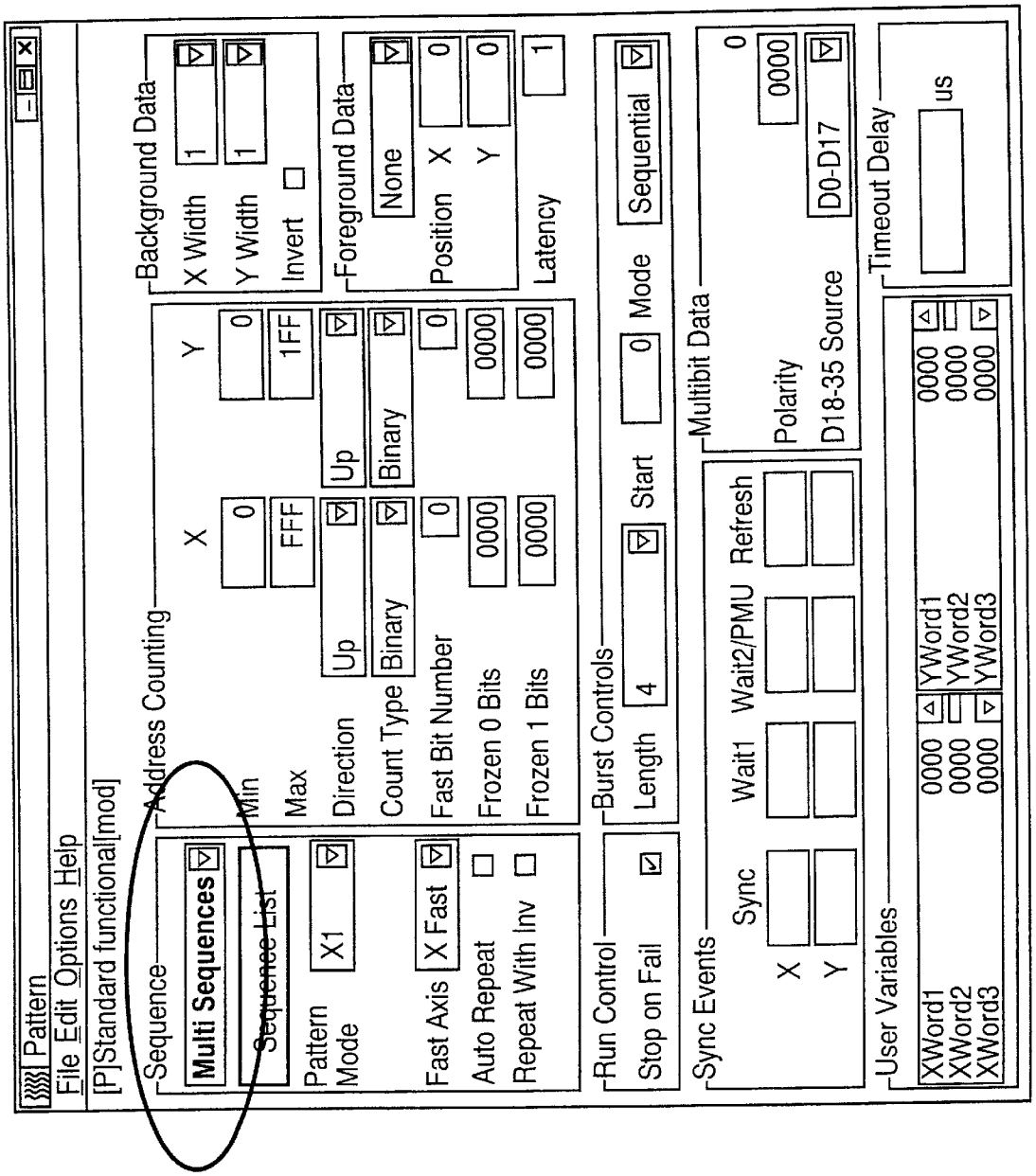
FIG. 9 is a dialog box in which a user may specify address and data patterns.

For example, under the "window" option of the tool bar 32, the user may select such an address pattern dialog box, shown in FIG. 9, that allows the user to specify how address counting is to be performed for each row (XAddress) and column (YAddress). The pattern window allows the user to specify a minimum and maximum address in a repetition range, count parameters such as direction (up or down), burst length, custom patterns, and the like.

Figure 10:
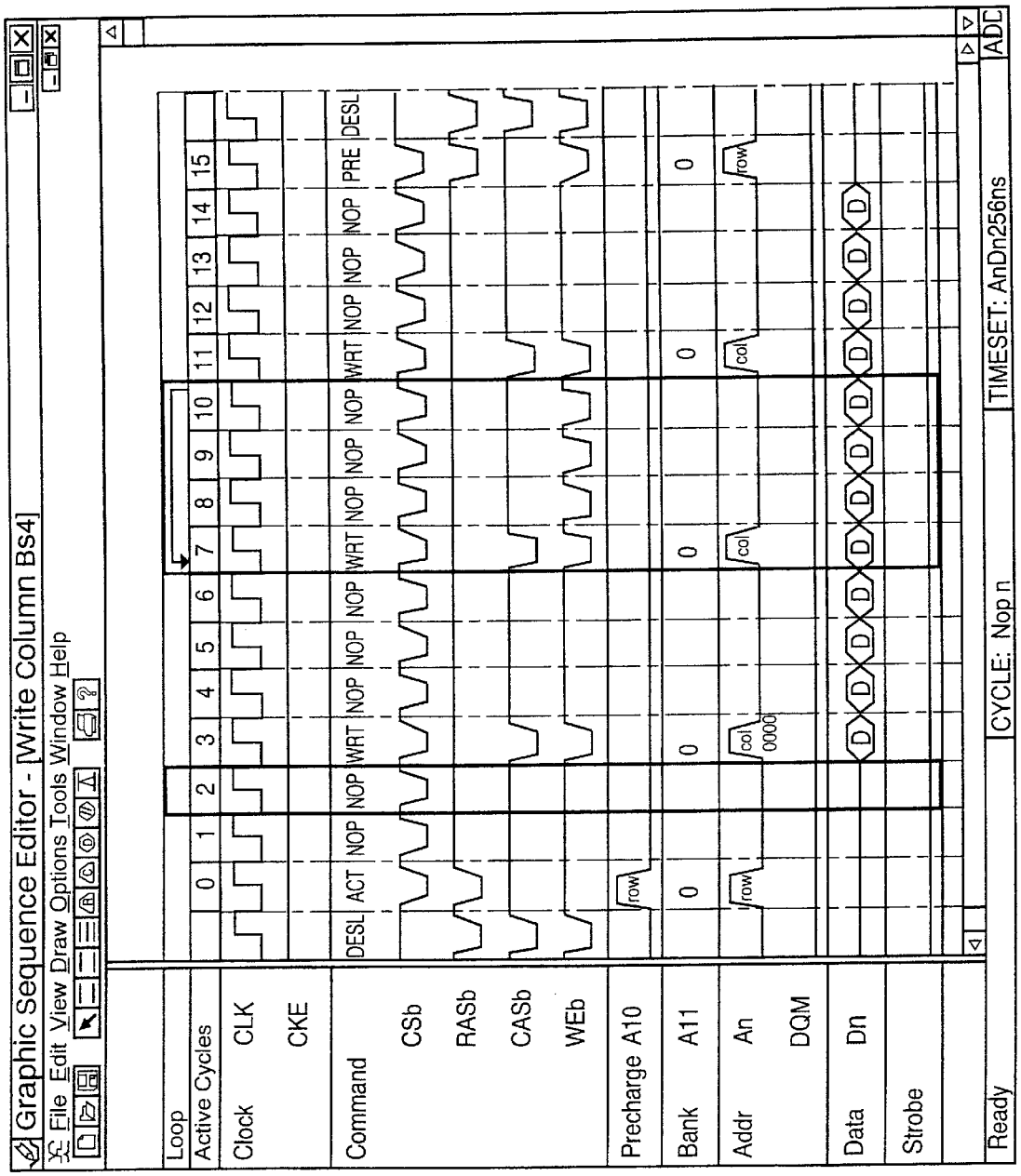
FIG. 10 is a view of a completed graphic sequence for a test which tests a write column operation with a burst length of four.
Figure 11:
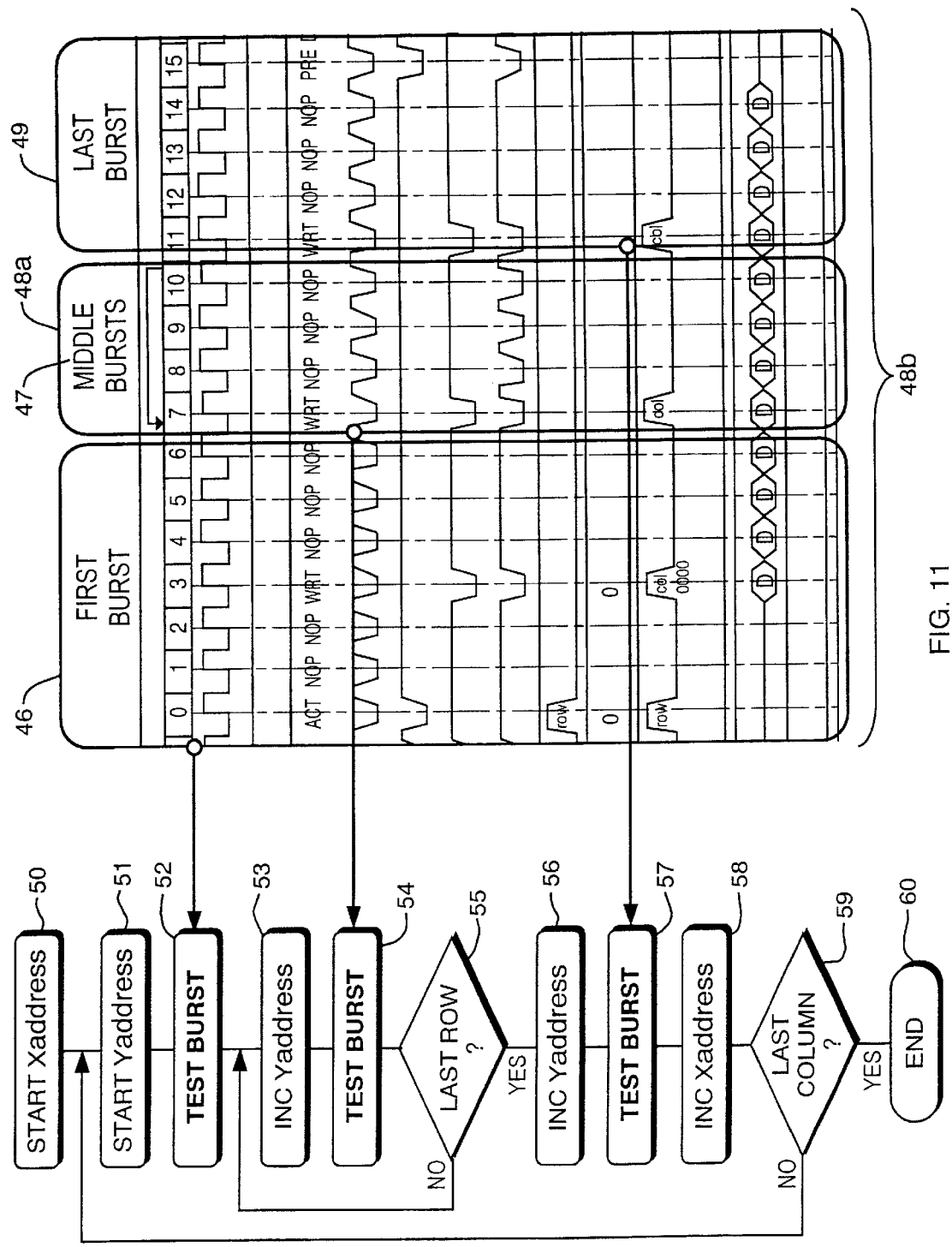
FIG. 11 illustrates how the graphic sequence is translated into a program during compilation of microcode for the test equipment.

FIG. 10 shows a completed graphic sequence for a write column test sequence; and FIG. 11 illustrates how the sequence of FIG. 10 is dissected to determine the corresponding sequence data structure 14 and ultimately the microcode tables 18.

Referring now to FIG. 11 more particularly, the cycles to the left of the arrow 42, cycles number 0 through 6, are interpreted as a first set, or burst, of cycles 46 to be applied to the device 23.

The test assumes that a group of middle bursts 47 specify operations to be repeated for a range of addresses. In this example, the middle bursts 47 are executed for each row of the array. An outer loop 48 consisting of column addresses is impliedly executed for each of the different columns in the array. The cycles in the last burst 49 are then executed in a final step.

The parser 15, loop organizer 16, and microcode generator 17 then interpret the graphic sequence to generate microcode to be performed as a series of steps 50 through 60 as shown.

In a first step 50, a starting XAddress (row address) is initiated. In a second step 51, a starting YAddress (column address) is initiated. In the next step 52, the initial test burst 46 is applied to the device. These three microcode steps 50, 51 and 52 are thus derived from the graphic indication of the first burst 46.

Following that, in step 53, the YAddress is incremented. In a next step 54, a test burst 47 is again applied to the device. In step 55, if this is not the last row in the memory, then processing returns to step 53 in which the YAddress is incremented and the test burst is again applied. These microcode steps are derived from the middle burst 47 graphical specifications.

If, however, this is the last row in step 55, then control proceeds to step 56 in which the YAddress is incremented. At this point, the middle bursts 47 are again applied in step 57. The XAddress then is incremented in step 58, and the column address value is tested in step 59. If this is not the last column, then processing returns back to step 51. If, however, the last column has been reached, then the test stops in state 60. These microcode steps are derived from the last burst 49.

Thus, the logic of a test sequence is implied by defining a first burst 46, a middle burst 47, and last burst 49 that correspond to the initial test step 52, a second or looping test step 54 and a final test step 57. In this manner, the user indicates, with the looping arrow 42, the boundaries of the initial test burst 52 and final test burst 57.

Figure 12:
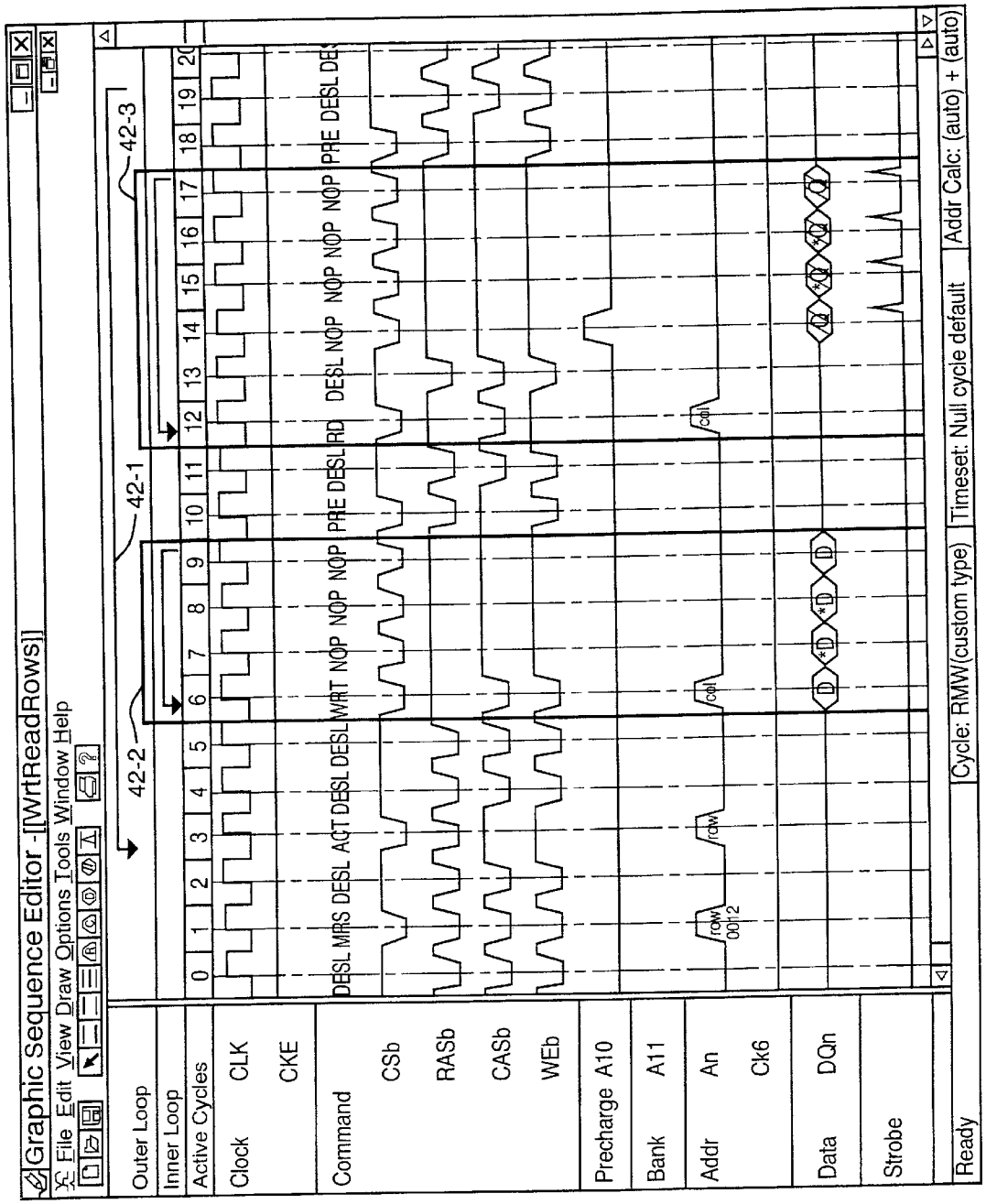
FIG. 12 is a graphic sequence containing a set of nested loops which specifies a more complex operation consisting of testing all rows in the memory, writing all bursts of each row and then reading all bursts of each row.

A more complicated test may be specified by a graphic sequence such as shown in FIG. 12. In this instance, the test is specified with multiple nested loops, and therefore, more complicated microcode 18 is created. In this particular example, the test iterates for each row of the memory array, writes all bursts of the row, and then reads all bursts of the row, with a burst length equal to 4.

The multiple nested loops are specified by the multiple looping arrows which define an outer loop 42-1 executed for each row of the memory device 23 and then a pair of inner loops 42-2 and 43-3, each executed for each column address of the memory 23.

Figure 13:
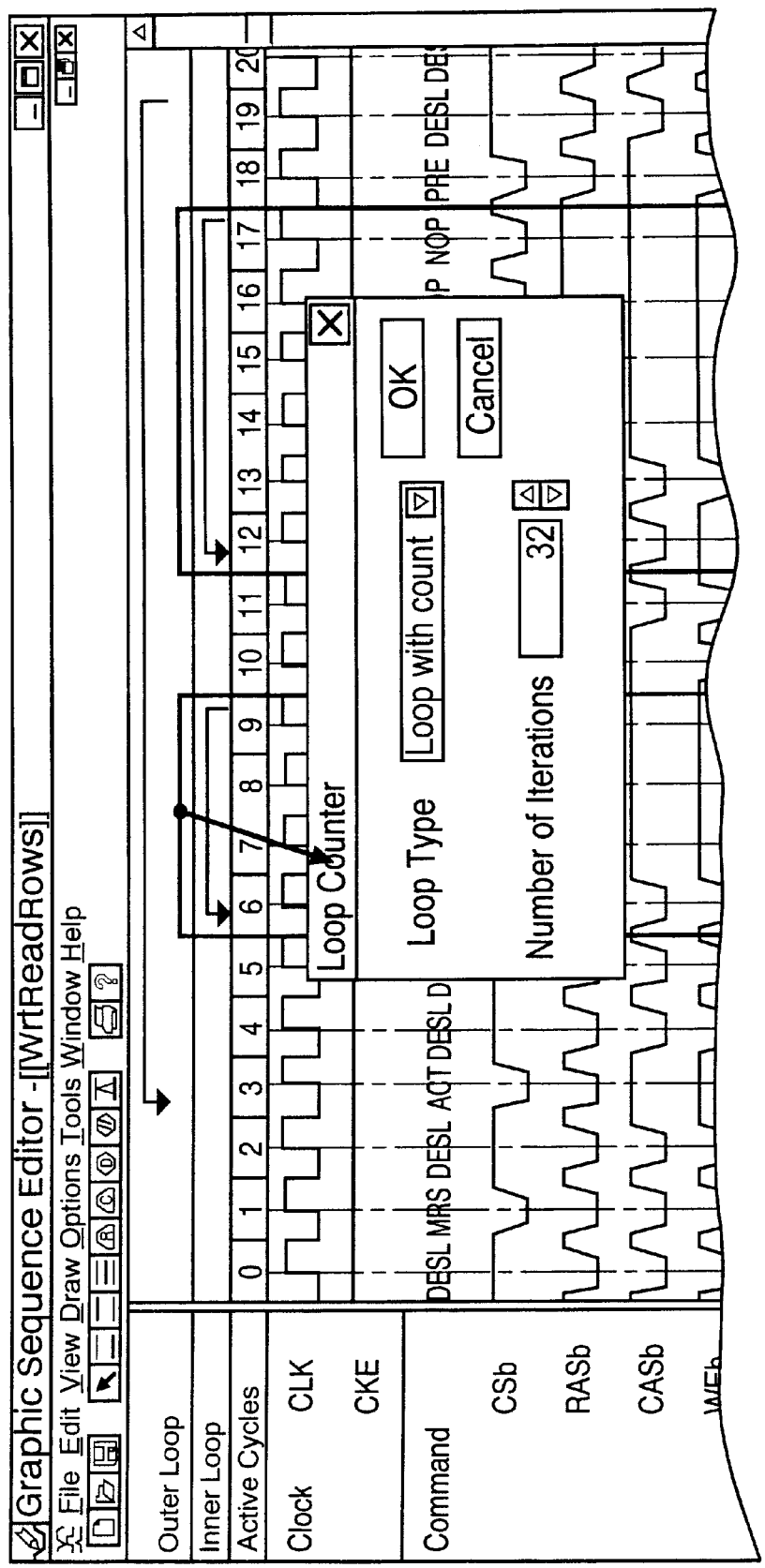
FIG. 13 shows how the user may further control looping by specifying an exact number of loop iterations.

In normal circumstances, the microcode generator 17 assumes that each of the rows and columns of an array are to be tested and therefore that loop arrows 42 specify impliedly that each possible row address or each possible column address is to be cycled through. However, FIG. 13 illustrates how a user may specify more detailed control over looping. In this example, the user is requesting only exactly 32 iterations of one of the inner loops 42-2, regardless of the total number of rows and columns in the memory device being tested.

EQUIVALENTS

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. In an electronic processor, a process for defining test signals to be applied to an electronic device under test, comprising the steps of:

(a) accepting from a user a graphic indication of logic states for each test signal as a set of test cycles to be applied to the device under test;

(b) accepting from a user a graphic indication that test cycles are to be repeated according to repetition parameters; and (c) converting the graphic indications of the logic states and repetition parameters to program code for execution on automatic test equipment, including repetition of graphically indicated test cycles.

2. A process as in claim 1 wherein step (b) additionally comprises:

accepting from the user a graphical loop indication placed adjacent a first cycle and a last cycle in a graphic depiction of a sequence of test cycles.

3. A process as in claim 2 wherein step (b) additionally comprises:

accepting from the user commands that manipulate the position and length of the loop indication, and thereby to select a first and last cycle in a repeated set of test cycles.

4. A process as in claim 1 wherein step (b) additionally comprises:

accepting from a user a specification of shading to be applied to a first cycle and a last cycle in a graphic depiction of a sequence of test cycles.

5. A process as in claim 1 wherein step (b) additionally comprises the step of:

accepting graphic indications of repetition parameters for nested repetitions of test cycles.

6. A process as in claim 1 in which step (c) converts the graphic indication of repetition parameters into program code which iterates a set of loop cycles for each of a plurality of possible storage locations in a memory device under test.

7. A process as in claim 1 wherein step (b) additionally comprises:

accepting user input specifying a number of test cycle repetitions to be executed.

8. A process as in claim 1 wherein step (b) additionally comprises:

accepting user input specifying a pattern of addresses to be applied during repetition of the test cycles.

9. A process as in claim 1 wherein the device under test is a memory component and step (b) additionally comprises:

accepting user input specifying where, in the set of test cycles, a memory row address is to change on each repetition.

10. A process as in claim 1 wherein the device under test is a memory component and step (b) additionally comprises:

accepting user input specifying where, in the set of test cycles, a memory column address is to change on each repetition.

11. A process as in claim 1 wherein the device under test is a memory component and step (c) additionally comprises the step of:

generating program code that produces test cycles which are repeated for each row of a memory device under test.

12. A process as in claim 1 wherein the graphic indication of repetition parameters additionally specifies a first sequence of test cycles, a second sequence of test cycles, and a third sequence of test cycles, the first sequence of test cycles indicating a first burst of logic signals to be applied to the device under test before the second sequence, the second sequence of cycles specifying a second burst of test cycles to be repeated, and the third sequence specifying a closing set of logic signals to be applied to the device after the repeated second bursts.

13. A process as in claim 1 additionally comprising the step of:

executing the program code on memory test equipment.

14. A process as in claim 13 in which the program code is transferred to memory test equipment located remotely from a processor which performs steps (a) through (c).

15. A process as in claim 1 wherein the test equipment comprises a plurality of parallel processors, and wherein step (c) of converting the graphic indications automatically generates program code for each of the several parallel processors.

16. A data processing system for testing an electronic device comprising:

a graphic sequence storage device, for storing a representation of visual indications of logic states for a test sequence consisting of logic states for test cycles and test cycle repetition parameters; and a microcode generator, for parsing the representation of visual indications to determine microcode instructions which cause test equipment to generate test signals corresponding to the test cycles and looping instructions for causing the test cycles to be repeated according to the repetition parameters.

17. A system as in claim 16 additionally comprising:

test equipment for running the microcode instructions, generating the test signals in response thereto, and applying the test signals to the electronic device being tested.

18. A system as in claim 16 wherein the electronic device being tested is a memory.

19. A system as in claim 18 wherein the test cycle repetition parameters specify how a memory row address is to be changed on each repetition.

20. A system as in claim 18 wherein the test cycle repetition parameters specify how a memory column address is to be changed on each repetition.

21. A system as in claim 18 wherein the test cycle repetition parameters specify how a memory data input is to be changed on each repetition.

22. A system as in claim 18 wherein the test cycle repetition parameters specify how a memory data output is expected to change on each repetition.

23. In an electronic processor, a process for defining test signals to be applied to a synchronous dynamic random access memory (SDRAM) device under test comprising the steps of:

(a) accepting from a user a graphic indication of the logic states of test signals to be applied to the SDRAM, the test signals each comprising a set of test cycles; the graphic indication of multiple test cycles being displayed adjacent one another;

(b) accepting from a user inputs which specify the position and length of a looping arrow located adjacent the graphic indication of multiple test signals, the looping arrow indicating a group of test cycles to be repeated according to repetition parameters;

(c) shading the group of test cycles to be repeated within the graphic indications of multiple test signals;

(d) accepting user input in a pop-up window specifying the repetition parameters;

(e) generating a microcode program for test equipment from the graphic indications of multiple test signals and the group of test cycles to be repeated; and (f) operating the test equipment according to the microcode instructions to apply test signals to the SDRAM that repeat according to the repetition parameters.

* * * * *